(12) United States Patent
Löfmark

(10) Patent No.: US 6,694,013 B1
(45) Date of Patent: Feb. 17, 2004

(54) FILTER ARRANGEMENT AND METHOD FOR TELECOMMUNICATION DEVICE

(75) Inventor: Bengt Löfmark, Skärholmen (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/354,716

(22) Filed: Jul. 16, 1999

(30) Foreign Application Priority Data

Jul. 2, 1999 (SE) .............................................. 9902541

(51) Int. Cl.⁷ .......................... H04M 1/00; H04M 9/00; H04M 9/08
(52) U.S. Cl. .............................. 379/399.01; 379/93.05; 379/398; 379/413.02; 379/414
(58) Field of Search .................... 379/399.01, 403–405, 379/413.02, 414–417, 93.05–93.06, 93.09, 398

(56) References Cited

U.S. PATENT DOCUMENTS 5,555,494 A  9/1996  Morris ........................ 363/17

FOREIGN PATENT DOCUMENTS

| EP | 0 742 972 B1 | 11/1996 |
|---|---|---|
| SE | 9800240-5 | 9/1999 |
| WO | WO95/21488 | 8/1995 |

*Primary Examiner*—Duc Nguyen

(57) ABSTRACT

The present invention relates to a filter arrangement (8C) and a method for frequency filtering and impedance conversion. The invention makes it possible to perform frequency filtering and impedance conversion using fewer inductors than what is required using previously known technique for obtaining the corresponding effect. According to an alternative aspect the invention provides more effective frequency filtering and equivalent impedance conversion compared to the prior art when the same number of inductors are used. According to the invention an electromotive force (e') is generated in at least one filter coil (L1, L4). The electromotive force is adjusted so that the filter arrangement (8C) receives a desired impedance converting effect. A filter arrangement according to the invention, compared to the prior art, in this manner provides a filter integrated with an impedance converter. Compared to the prior art the invention can make a saving of one transformer per impedance converter possible.

18 Claims, 7 Drawing Sheets

FILTER ARRANGEMENT AND METHOD FOR TELECOMMUNICATION DEVICE

TECHNICAL FIELD

The present invention relates to a filter arrangement and a method for a telecommunication device.

BACKGROUND ART

In telecommunication systems of today it has become more and more common that information of different types are transmitted on a common transmission line in different frequency bands. An example of such a system is ADSL (Asymmetric Digital Subscriber Line) which enables parallel transmission of conventional speech telephony (POTS) and wideband services, such as video or data, over conventional copper twin cable networks. This technique makes it possible to use existing copper twin cable networks more efficiently, which is of utmost interest since it is very costly and time-consuming to replace the copper cable with, for example, an optical fibre having higher capacity. There is also a high feed embodiment of ADSL termed VADSL or VDSL (Very High Speed ADSL).

Since POTS traffic only uses the frequency band up to 4 kHz, a large part of the frequency band available in PSTN (Public Switched Telephone Network) is often unused. In an ADSL system a larger frequency range such as for example 25–1000 kHz is used for wideband services of about 1,5–6 Mbit/s. The information transmitted in the higher frequency range is termed ADSL traffic or ADSL signals. When the telecommunication traffic reaches a receiver of a subscriber or in a central office of a service provider, the POTS and ADSL traffic is separated, often with the use of a so called splitter filter. The splitter filter comprises a low pass filter between the transmission line and the telephone of the subscriber/the line card of the central office and a high pass filter between the transmission line and the ADSL receiver of the subscriber or in the central office.

In order to obtain optimal transmission characteristics and in order to avoid echoing, it is advantageous if the filter used on the telephone side of the ADSL system have an impedance similar to the impedance of the transmission line, which is described by John Cook and Phil Sheppard in "ADSL and VADSL Splitter Design and Telephony Performance", IEEE Journal on selected areas in communications, Volume 13, No. 9, December 1995. Since the copper twin cable has a complex impedance it is desired that also the impedance of the filter is complex. It is however not possible to manufacture lossless passive filters having a complex impedance, but by imbedding the passive filter between impedance converters, so called GICs (General Impedance Converter) the impedance of the filter appears to be complex outside the impedance converters. This technique is described in the paper by John Cook and Phil Sheppard cited above and in the European patent EP0742972. GICs can be implemented in several different ways, for example such as is described in the document cited above or as is described in the Swedish patent application SE 9800240-5.

A problem with the technique described above is that filters are very expensive. In an ADSL system two splitter filters per subscriber are required, consequently if the cost for one filter can be reduced large savings can be achieved. For this reason one strives to manufacture filters having as few and as inexpensive components as possible. This must be balanced against the fact that the filters can be made more effective the more components they have. In the selection of filter a trade-off between costs and quality must thus be made.

SUMMARY

As stated above the costs for a splitter filter constitute a large portion of the total costs in a telecommunication system where information is transmitted in different frequency bands, such as in an ADSL or VADSL system. It is therefore desirable to manufacture splitter filters comprising as few and as inexpensive components as possible. Inductors and components comprising inductors, such as filter coils and transformers, are expensive components, which it is desirable to have as few as possible of in a splitter filter. However, there is a problem in that in a filter having few filter coils there are fewer degrees of freedom for adjusting the efficiency of the filter than in a filter having many filter coils. A filter having many filter coils can thus provide better characteristics, for example better stop band attenuation or a smoother pass band, than one having few coils.

According to a first aspect the present invention deals with the problem of how a filter arrangement can be implemented having fewer inductors in order to obtain a lower cost while at the same time the characteristics of the filter arrangement is not worsened and how a method for frequency filtering and impedance conversion can require as few inductors as possible without reducing the quality.

According to a second aspect the present invention deals with the problem how a filter arrangement can be given better characteristics without increasing the total number of inductors in the filter arrangement and how a method for frequency filtering and impedance conversion can be improved without using more inductors.

The object of the present invention is thus to obtain an efficient and worthwhile filter and to obtain an efficient and worthwhile method for frequency filtering and impedance conversion.

The invention solves the problem according to the first aspect by means of integrating the filter and an impedance converter connected to the filter. This is obtained in that an already present filter coil is provided with an additional winding and is used both as a filter component and as a component in the impedance converter. The filter coil having the additional winding can replace a transformer in the impedance converter, which results in saving one inductor.

The invention solves the problem according to the second aspect by means of integrating the filter and an impedance converter connected to the filter. This is obtained by means of replacing a transformer in the impedance converter with a component having two windings. This component is impedance converting and at the same time one of the windings is used as a filter coil. Hereby the filter arrangement is given an additional active filter component without increasing the total number of inductors. The additional active filter component can be used for improving the characteristics of the filter arrangement.

Thus, the invention according to both the first and the second aspect provides an efficient filter arrangement and a method comprising an integrated unit, which acts both as an impedance converter and as a filter.

The invention according to the first aspect is related to the case when a filter having at least one filter coil is flanked by at least one impedance converter (GIC), which comprises a transformer. The impedance converter senses an electrical magnitude in or in connection with the filter and adds a serial voltage, which is dependant upon the sensed electrical magnitude, to the circuit. According to the invention the filter coil can be provided with an additional winding and replace the transformer, whereby the filter characteristics and the added GIC serial voltage are maintained. This is obtained in that the additional winding of the filter coil is supplied with a current I so that an electromotive force e' is induced in the filter coil. The current I is chosen so that the induced electromotive force e' is equal to the GIC serial voltage. The filter coil having the additional winding is at the same time used as a frequency filtering component in the filter and provides the same filter characteristics as the original filter coil. The invention can thus, according to the first aspect, contribute to saving one transformer per GIC compared to the prior art.

The invention according to the second aspect is related to the case when a splitter filter is flanked by at least one impedance converter (GIC), which comprises a transformer. The impedance converter senses an electrical magnitude in or in connection with the filter and adds a serial voltage, which is dependent upon the sensed electrical magnitude, to the circuit. According to the invention, the transformer can be replaced by a component having two windings, where the first winding is used as an active filter component and which generates the GIC voltage e by means of feeding the current I to the second winding, so that an electromotive force e' is induced in the first winding. The current I is chosen so that the induced electromotive force e' is equal to the GIC voltage e. The first winding providing an active filter can be used for improving the characteristics of the filter. Thus, the invention according to the second aspect can contribute to the implementation of a more effective filter arrangement and a more effective method, which use the same number of inductors as a corresponding filter arrangement and a corresponding method according to prior art. This is obtained by means of increasing the number of inductors acting as active filter components without increasing the total number of inductors in the filter arrangement.

An advantage of the invention according to the first aspect is that a more inexpensive filter arrangement and a more inexpensive method for separating information transmitted in different frequency bands in a telecommunication system can be made without deteriorating the filter characteristics. A filter arrangement according to the invention becomes more inexpensive than previously known solutions, having the same filter characteristics, since it can be made using fewer expensive transformers. An additional advantage of the invention according to the first aspect is that the filter arrangement according to the invention occupies less space than the previously known solutions since transformers are relatively large components.

An advantage of the invention according to the second aspect is that one can implement a filter arrangement and a method for separating information which is transmitted in different frequency bands in a telecommunication system, where the filter arrangement has better filter characteristics than previously known solutions having the same number of inductors and where the method provides better filter characteristics than previously known methods using the same number of inductors.

Yet another advantage of the invention according to both the first and the second aspect is that a filter arrangement and a method for separating information transmitted in different frequency bands in a telecommunication system can be implemented, where the inductors used are utilized more efficiently than in corresponding filter arrangements and methods according to the prior art.

The invention will now be described in more detail using preferred embodiments and with reference to the accompanying drawings.

DESCRIPTION OF PREFERRED EMBODIMENTS

Figure 1:
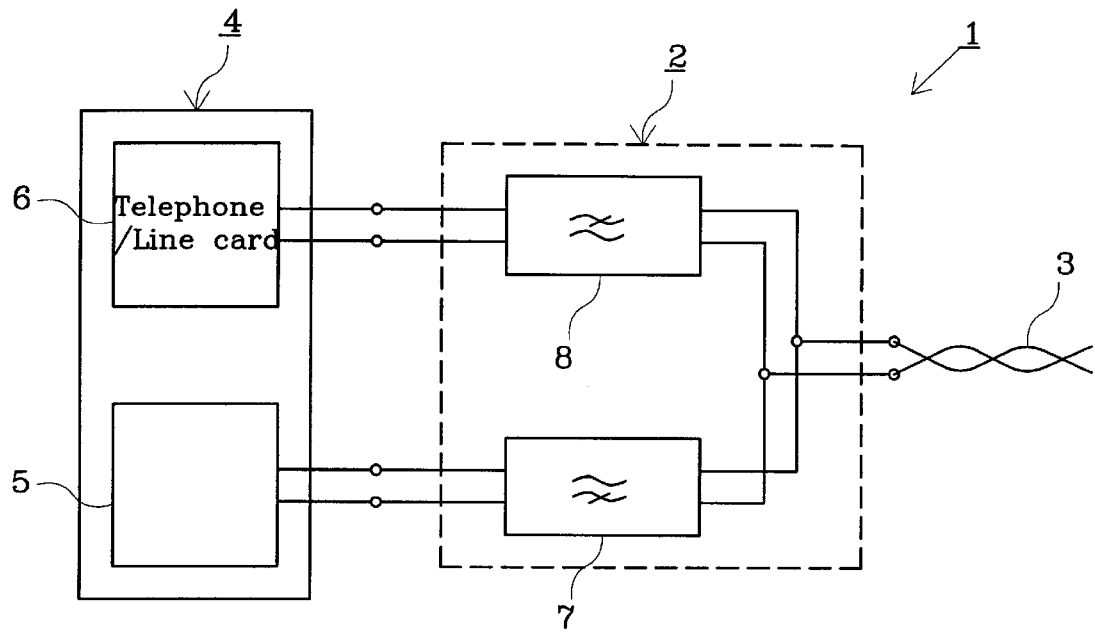
FIG. 1 shows a block diagram of a part of a telecommunication system comprising a splitter filter.

In FIG. 1 a part of a telecommunication system 1 adapted for ADSL, which comprises a splitter filter 2, is shown. The splitter filter 2 is used for splitting telecommunication signals arriving over a transmission line 3 to a subscriber equipment or a central office 4 as ADSL signals and POTS signals. The ADSL signals are received by an ADSL receiver 5 in the subscriber equipment/central office 4 whereas the POTS signals are directed to the subscriber telephone/the line card of the central office 6. POTS uses the frequency band up to 4 kHz whereas ADSL uses higher frequencies, usually 25–1000 kHz. A high pass filter 7 is therefore located between the transmission lines 3 and the ADSL receiver 5 for letting through high frequency ADSL signals and to block the POTS traffic. In the same manner a low pass filter arrangement 8 lets through the POTS traffic to the telephone/line card 6 and blocks the ADSL signals.

Figure 2:
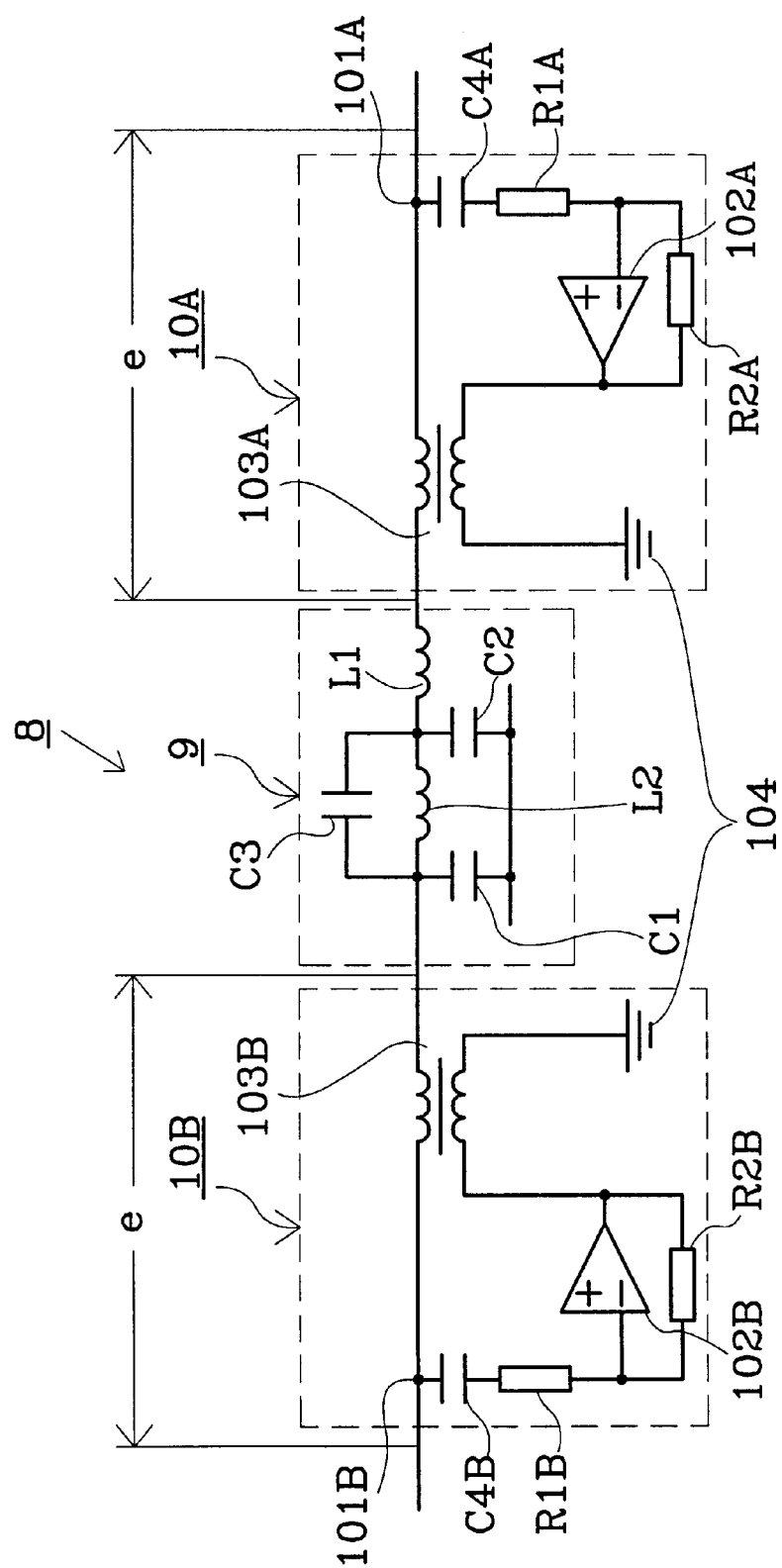
FIG. 2 shows a circuit diagram of a filter arrangement according to the prior art.

In FIG. 2 a low pass filter arrangement 8 according to the prior art is shown in more detail in an unbalanced embodiment. In accordance with the above description under the heading "background art" it is desirable that the low pass filter arrangement 8 has a complex impedance as seen from the transmission line in order for the transmission characteristics to be as good as possible. For this reason a passive low pass filter 9 is embedded between two impedance converters 10A, 10B. The impedance converters 10A, 10B see to it that the low pass filter 9, having a real impedance, appears to have a complex impedance as seen from the transmission line 3 and from the telephone/line card 6. In this case the starting point is that the telephone/line card 6 is set to work against a complex impedance, but if that is not the case it is advantageous to omit the impedance converter 10B so that the telephone/line card 6 perceives a real impedance of the filter arrangement 8. The filter 9 in FIG. 2 comprises two coils L1, L2 and three capacitors C1,C2,C3.

The impedance converters 10A, 10B each adds a voltage in series with the filter 9, the so called GIC voltage e. The impedance converters 10A, 10B senses a voltage towards the filter in the points 101A and 101B, respectively and create the serial voltage e, which is dependant upon the sensed voltage u. In the unbalanced embodiment of the low pass filter arrangement 8 shown in FIG. 2 the sensed voltage u is the voltage between the point 101A and 101B, respectively and ground, but in the balanced embodiment it is the voltage between the balanced input terminals that is sensed. The impedance converter 10A/10B comprises a capacitor C4A/C4B, two resistors R1A/R1B and R2A/R2B, an amplifier 102A/102B and a transformer 103A/103B having a first and a second winding around a core, where the second winding is connected to ground 104. The capacitor C4A/C4B gives the impedance converter 10A/10B a high pass function, which means that it is transparent for low frequencies but amplifies high frequencies.

The GIC voltage e can be calculated according to the formula $$e = k_{GIC} \cdot U,$$

where $k_{GIC}$ is the amplifying factor of the impedance converter and u is the mentioned sensed voltage.

Figure 3:
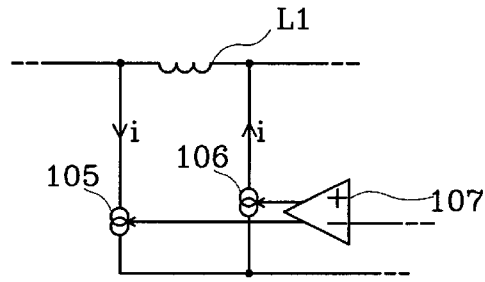
FIG. 3 shows a circuit diagram of a part of a filter arrangement according to the invention.
Figure 4:
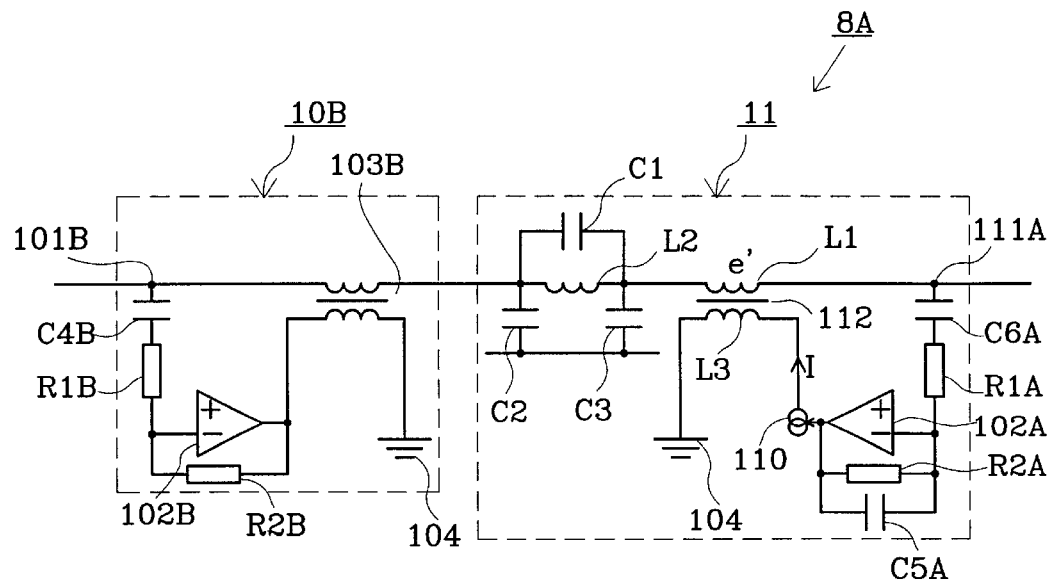
FIG. 4 shows a circuit diagram of a filter arrangement according to a first aspect of the invention.

The idea of the invention according to the first aspect is to generate the GIC voltage e by means of inducing an electromotive force e' which is equal to e in an already existing filter coil. The electromotive force e' can be induced directly by means of feeding a current $I_L$ through the filter coil and is given by the formula $$e' = j\omega L I_L,$$

where j is the imaginary unit $\sqrt{-1}$ and $\omega$ is the angular frequency. If $I_L$ is chosen so that e'=e the transformer of the impedance converter becomes redundant. However in order not to affect the rest of the filter arrangement one would have to inject the current $I_L$ to the one end of the filter coil and take it out at the other end. This can be obtained by using two current sources, which are made to work in antiphase as is shown in FIG. 3. Two current generators 105, 106 are controlled by an amplifier 107 having two balanced output terminals. In the figure arrows show how a current i is injected to the filter coil L1. This is however not the most attractive solution. It requires many components (four current generators in a balanced embodiment). The current sources must be able to work at high voltages and it is difficult to avoid phase errors between the current sources, which can affect the transfer function of the filter. A more attractive way of implementing the electromotive force e' is to make it indirectly, via mutual induction. In FIG. 4 a filter arrangement according to the invention where mutual induction is used in this manner is shown. The reference numerals used are the same as in FIG. 2 when a component in FIG. 4 has an obvious corresponding component in FIG. 2. This is to facilitate the comparison between the invention and the background art.

FIG. 4 shows a low pass filter arrangement 8A according to the invention, which, if it is compared to the filter arrangement 8 according to the background art in FIG. 2, illustrates the invention according to the first aspect, i.e. the filter arrangement 8A according to the invention has fewer inductors than the filter arrangement 8 according to the background art. The filter arrangement 8A comprises an impedance converter 10B, which is identical to the impedance converter 10B in FIG. 2, and an integrated unit 11 which functionally corresponds to the filter 9 and the impedance converter 10A in FIG. 2. The integrated unit comprises three capacitors C1, C2, C3 and two coils L1, L2 with active filter effect. These components correspond to the filter components in the filter 9 in FIG. 2. The coil L1 is used in the integrated unit both as an active filter component and for generating the GIC voltage e. The GIC voltage e is generated by means of providing the coil L1 with an additional winding L3 on a common core 112. The additional winding L3 is fed with the current I and by means of mutual induction provides an induced electromotive force e' in the coil L1. I is chosen so that the induced electromotive force e' becomes equal to the GIC voltage e. The current I is generated by a current generator 110 and is dependant on the voltage u towards the filter arrangement which is sensed in the point 111A. As to the rest, the integrated unit 11 comprises an amplifier 102A, which generates a control signal to the current generator 110 and two resistors R1A, R2A contributing to the impedance converting characteristics of the integrated unit and which corresponds to the same components in the impedance converter 10A in FIG. 2. A capacitor C5A contributes to that the integrated unit 11, as impedance converter, gets the same transfer function as the impedance converter 10A in FIG. 2 and a capacitor C6A blocks unidirectional current to the amplifier 102A. The filter characteristics for the low pass filter arrangement 8A is the same as for the filter arrangement 8 in FIG. 2, but it comprises one transformer less which provides a smaller and more inexpensive filter arrangement.

The electromotive force e' which is induced in the filter coil L1 by means of mutual induction can be calculated as:

$$e' = j\omega k \sqrt{L_1 L_3} \cdot I,$$

where k is the coupling factor between L1 and L3. For the electromotive force e' to be equal to the GIC voltage e the current I, which is fed to the additional winding L3, must fulfil the condition $$I = \frac{k_{GIC} \cdot u}{j\omega k \sqrt{L_1 L_3}}.$$

Figure 5:
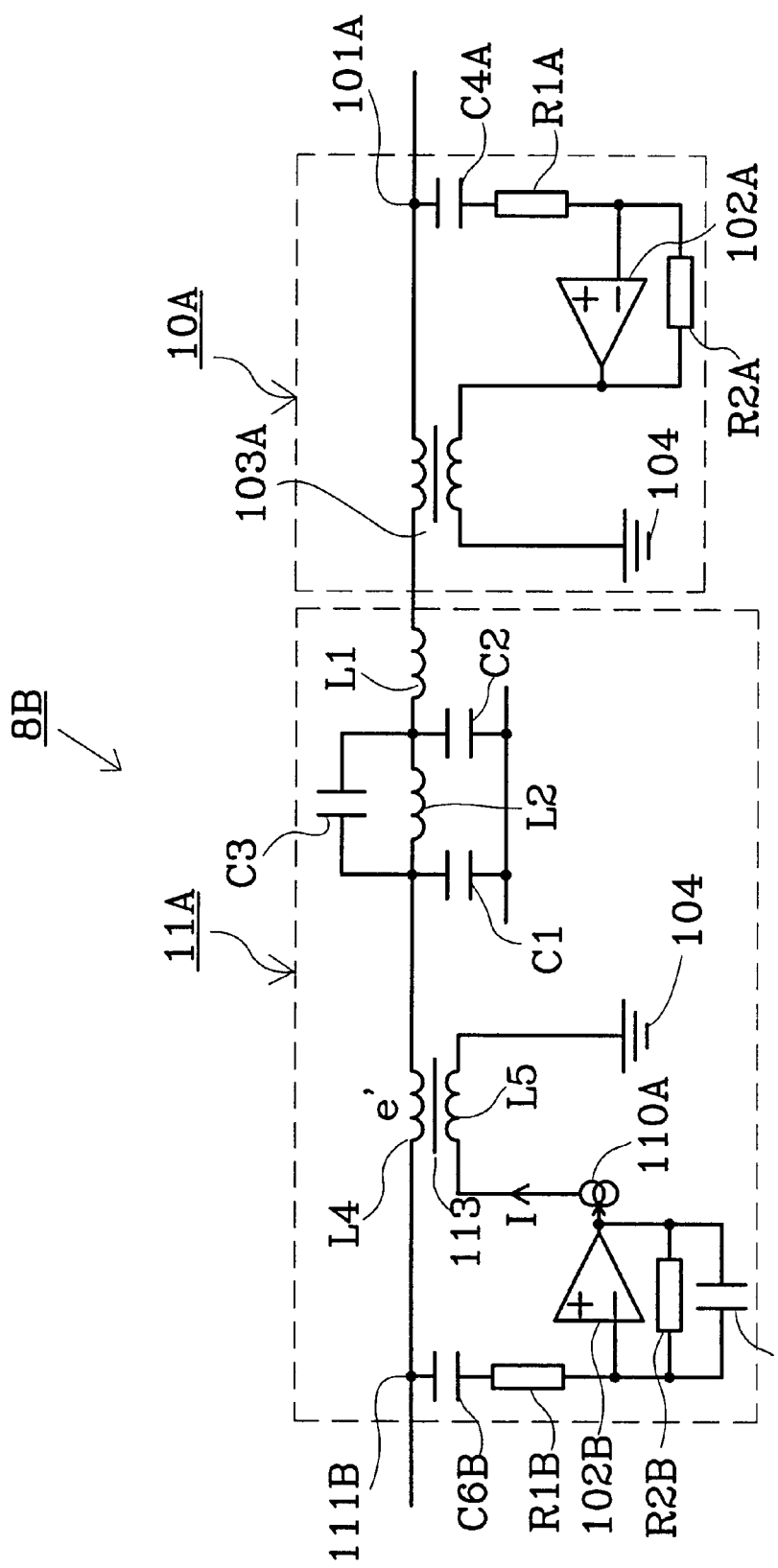
FIG. 5 shows a circuit diagram of a filter arrangement according to a second aspect of the invention.

FIG. 5 shows a low pass filter arrangement 8B according to an alternative embodiment of the invention. In comparison with FIG. 2 the filter arrangement 8B shows the invention according to the second aspect, i.e. the filter arrangement has, compared to the previously known filter arrangement 8 in FIG. 2, been provided with one additional filter coil without increasing the total number of inductors. In order to facilitate the comparison between the invention and the background art the reference numerals in FIG. 5 are the same as in FIG. 2 when a component in FIG. 5 has a clear corresponding component in FIG. 2.

The filter arrangement 8B comprises an impedance converter 10A, which is identical with the impedance converter 10A in FIG. 2, and an integrated 11A, which, functionally, corresponds to the impedance converter 10B in FIG. 2 and a low pass filter having one filter coil more than the filter 9 in FIG. 2. The integrated unit 11A comprises three capacitors C1, C2, C3 and two coils L1, L2 having active filter effect. These components correspond to the filter components in the filter 9 in FIG. 2. The integrated unit 11A further comprises an additional coil L4 having active filter effect, which also is used for generating the GIC voltage e. The GIC voltage e is generated by providing the coil L4 with an additional winding L5 on a common core 113. The additional winding L5 is fed with the current I and by means of mutual induction generates an induced electromotive force e' in the coil L4. I is chosen so that the induced electromotive force e' becomes equal to the GIC voltage e. The current I is generated by a current generator 110A and is dependant on the voltage u towards the filter arrangement which is sensed in the point 111B. Further, the integrated unit 11A comprises an amplifier 102B, which generates a control signal to the current generator 110A and two resistors R1A, R2B which contribute to the impedance converting characteristics of the integrated unit and which correspond to the same components in the impedance converter 10B in FIG. 2. A capacitor C5B contributes to that the integrator unit 11A, as an impedance converter, gets the same transfer function as the impedance converter 10B in FIG. 2 and a capacitor C6B blocks unidirectional current to the amplifier 102B. Since the low pass filter arrangement 8A has an additional active filter component in the coil 4 used for two purposes, the filtering can be made better than for the filter arrangement 8 in FIG. 2. This despite the fact that the total number of inductors is equal for both filter arrangements 8, 8B. The coil L4 gives the filter arrangement 8B an additional degree of freedom which can be used for, e.g. providing a steeper filtering or stop band attenuation or a smoother pass band. The filter arrangement 8B is thus more efficient than previously known solutions without comprising additional inductors.

A difference between the filter arrangements 8 and 8B is that the transformer 103B in the filter arrangement 8 is replaced with a coil L4 having an additional winding L5 on a common core 113, where the additional winding L5 is fed with current. Since also a transformer comprises a core having two windings it is possible to implement a filter arrangement 8B by means of feeding current through one of the windings of the transformer 103B and use it as the additional winding L5 whereas the second winding acts as the double acting coil L4. The difference between the filter arrangements 8 and 8B is then the current feeding of one of the transformer windings, using the current generator 110A, and the additional capacitor C5B.

The electromotive force e' which is induced in the coil L4 by means of mutual induction is calculated in the corresponding manner as the induced electromotive force in the filter coil L1, which was described in conjunction with FIG. 4, i.e.

$$e' = j\omega k \sqrt{L4 \cdot L5} \cdot I.$$

In the formula above k denotes the coupling factor between L4 and L5. In order for the electromotive force e' to be equal to the GIC voltage e the current I, which is fed to the additional winding L5, must fulfil $$I = \frac{k_{GIC} \cdot u}{j\omega k \sqrt{L4 \cdot L5}}.$$

Two alternative embodiments according to the first and second aspect of the invention have been described above with reference to FIG. 4 and FIG. 5 and in comparison with the previously known technique in FIG. 2. With the aid of FIG. 4 it was shown how the idea of the invention can be used on the right side of the filter 9 in FIG. 2 in order to obtain a transformer saving, whereas FIG. 5 was used for showing how the idea of the invention can be used on the left side of the filter 9 in FIG. 2 in order to give the filter arrangement an additional filter coil. It is of course possible to use the idea of the invention on both the left and right side of the filter 9 at the same time in order to obtain both a transformer saving and an additional filter coil. This scenario is described in FIG. 6. The right side of the filter arrangement 8C in FIG. 6 corresponds to the integrated unit 11 in FIG. 4 and the left side corresponds to the integrated unit 11A in FIG. 5. The components in the filter arrangement 8C have been given reference numerals in the same manner as the correspondent components in FIG. 4 and FIG. 5. The functions of the components are the same as for their corresponding components in the previously described figures and are therefore not described in detail here. The filter arrangement 8C comprises the capacitors C1, C2, C3, C5A, C5B, C6A and C6B, the resistors R1A, R1B, R2A and R2B, the amplifiers 102A and 102B, the current generators 110 and 110A, the coils L1, L2 and L4, where L1 and L4 are used for two purposes for providing the GIC voltage e in the ends of the filter arrangement, and the additional windings L3 and L5, which are fed with current from the current generators 110 and 110A respectively and which by means of mutual induction with the coils L1 and L4 respectively generates the GIC voltage e in the respective coils. In this example it has been assumed that the GIC voltages generated in the coil L1 and in the coil L4 are equal and the same reference e has been used for referring to these voltages. In reality these voltages are almost always different.

As mentioned the filter arrangement 8C shows how the invention according to the first and second aspect can be used on each side of a filter when it is surrounded by an impedance converter at each side. An additional embodiment of the invention is to use the invention according to the second aspect on both sides of a filter surrounded by impedance converters. In this manner a filter arrangement having two additional filter components but the same total number of inductors as the original filter and impedance converters is obtained. In this manner an even more efficient filter can be implemented using the same number of inductors.

If one starts with a filter surrounded by impedance converters where the filter at both sides has a filter coil in series with a transformer in each respective impedance converter the invention according to the first aspect can be used on both sides of the filter in order to save a transformer at each side. This is obtained analogous to the way of saving a transformer described in conjunction with FIG. 4.

Even if a filter does not have a coil directly in series with a transformer in an adjacent impedance converter it is possible to use the invention according to the first aspect in order to obtain a transformer saving. This is possible by using a filter coil which is not connected directly in series with the impedance converter for two purposes in the same manner as is described above, i.e. both as filter component and as impedance converter component. This possibility is depicted in FIG. 7.

Figure 6:
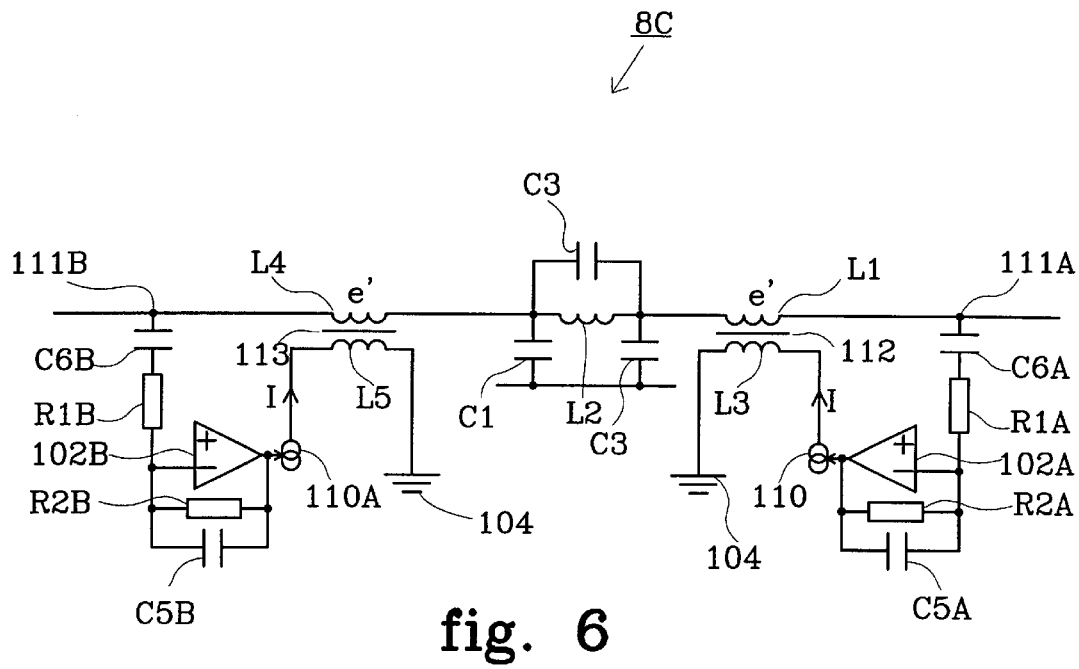
FIG. 6 shows a circuit diagram of a filter arrangement according to both a first and a second aspect of the invention.
Figure 7:
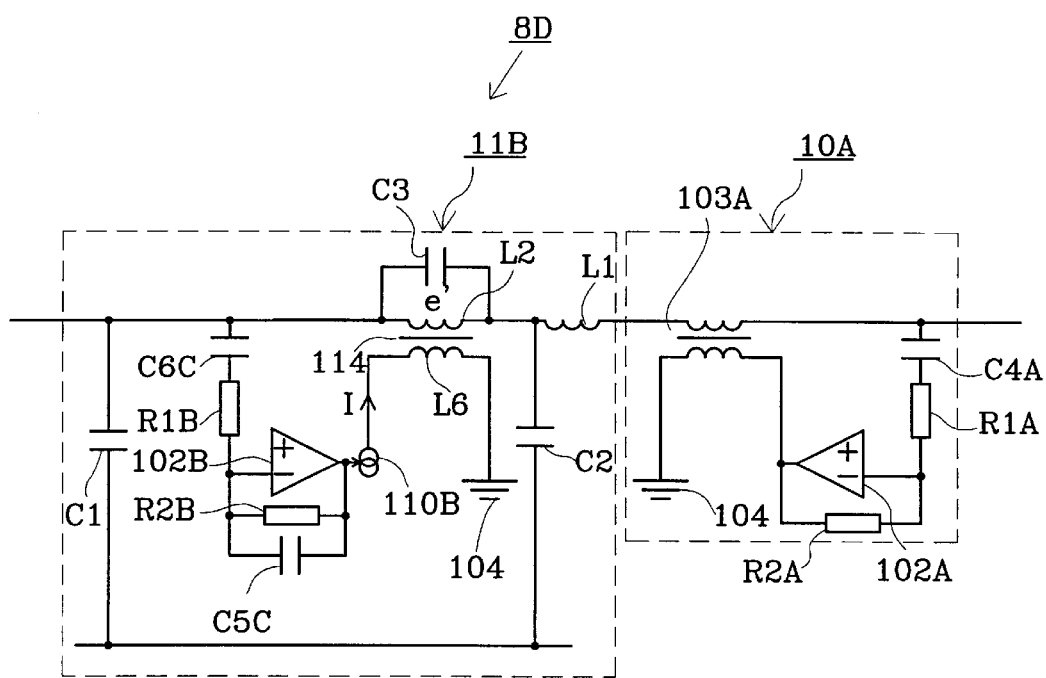
FIG. 7 shows a circuit diagram of an alternative embodiment of a filter arrangement according to the first aspect of the invention.

FIG. 7 shows a low pass filter arrangement 8D according to an alternative embodiment of the invention. As above this embodiment of the invention is described in view of the differences compared to the previously known filter arrangement 8 in FIG. 2 and the reference numerals in FIG. 6 are, as earlier, the same as in FIG. 2 when a component in FIG. 7 has a clear corresponding component in FIG. 2.

The filter arrangement 8D comprises an impedance converter 10A, which is identical with the impedance converter 10A in FIG. 2 and an integrated unit 11B, which functionally corresponds to an impedance converter and a low pass filter. The integrated unit 11B comprises three capacitors C1, C2, C3 and two coils L1, L2 having active filter effect. These components correspond to the filter components in the filter 9 in FIG. 2, but the capacitor C1 has been moved so that the coil L2 can be used for two purposes according to the invention. The coil L2 is provided with an additional winding L6 on a common core 114. The additional winding L6 is fed with the current I from a current generator 110B so that an electromotive force e' is induced in the coil L2. The current I is chosen so that the induced electromotive force e' becomes equal to the GIC voltage e. Further, the integrated unit 11B comprises an amplifier 102B and two resistors R1B, R2B which contribute to the impedance converting characteristics of the integrated unit and which correspond to the same components in the impedance converter 10B in FIG. 2, and two capacitors C5C and C6C, where the capacitor C5C contributes to the integrated unit 11B, as impedance converter, having the desired transfer function, and the capacitor C6C blocks unidirectional currents to the amplifier 102B.

If one starts from the impedance converter 10B and the filter 9 in FIG. 2 the integrated unit 11B is obtained by moving the capacitor C1, removing the transformer 103B, adding the capacitor C5C and the current generator 110B, which is arranged to feed an additional winding L6 on the same core as the coil L2 with current. The idea with these changes is to save a transformer without affecting the characteristics of the impedance converter 10B and the filter 9. The integrated unit 11B acts as an impedance converter and a filter, but with the above-mentioned changes the characteristics will not exactly correspond to the characteristics of the impedance converter 10B and the filter 9. Depending on the values of the components, tolerances and requirements, this is acceptable or not. One can slightly modify the impedance converting characteristics of the integrated unit 11B for correcting the differences compared to the impedance converter 10B and the filter 9. At high frequencies the capacitor C2 noticeably affects the impedance conversion in the integrated unit 11B, but has negligible effect at lower frequencies. Since the impedance conversion is only interesting in the speech band, i.e. frequencies up to 4 kHz, this effect will be small in reality. However, one characteristic, which will be noticeably affected, is the stop band attenuation.

Figure 8:
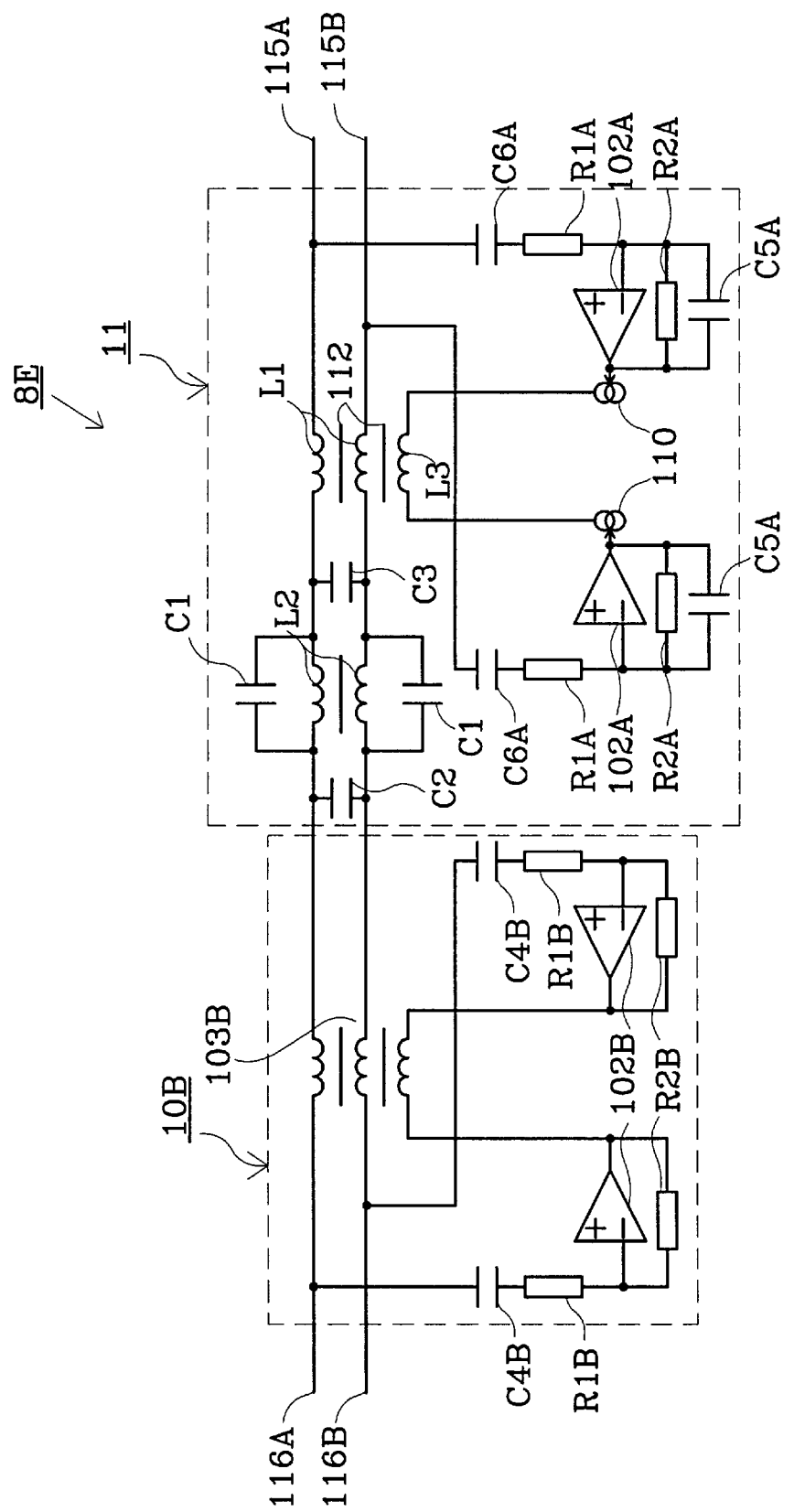
FIG. 8 shows a circuit diagram of an embodiment of a filter arrangement in a balanced embodiment according to the invention.

The embodiments above have all been shown in an unbalanced form. In FIG. 8 a low pass filter arrangement 8E corresponding to the filter arrangement 8A in FIG. 3 is shown in a balanced embodiment.

In FIG. 8 the same reference numerals have been used for corresponding components in the balanced halves and the reference numerals are also the same as for the corresponding components in the unbalanced embodiment in FIG. 4. This is done to facilitate a comparison between the figures. Since the reference numerals and the function of the components are the same as for their corresponding components in FIG. 4, they are not described in more detail here. A difference between the balanced filter arrangement 8E and the corresponding unbalanced arrangement 8A is that the voltage u is sensed between the balanced input terminals 115A and 115B and 116A and 116B, respectively, instead of between the sensing points 101A, 101B and ground. It should also be noticed that in the balanced form only one additional winding L3 is required for inducing the electromotive force e' in the two filter coils L1 in the balanced halves. In this manner one obtains a component having three windings around a common core 112.

In all embodiments described so far the starting point has been a filter 9 of the fourth degree surrounded by impedance converters on which the invention has been reduced to practice. The invention is of course not limited to a particular filter type but can be used in combination with most filter types in analogy with what has been described above. Furthermore, it is not required that the starting point is a filter having impedance converters on both sides. As mentioned above it is sometimes desirable only to have one impedance converter towards the transmission line. In the case when the telephone/line card 6 is set to work against a real impedance it is better to let the telephone/line card meet the real impedance of the low pass filter and thus not perform any impedance conversion on the side of the filter facing the telephone/line card 6.

Figure 9:
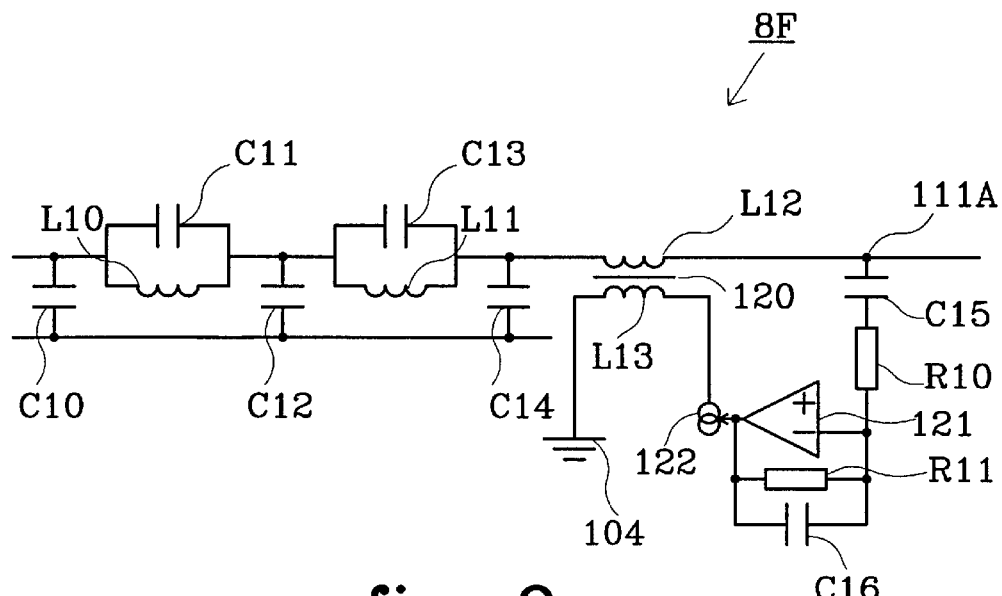
FIG. 9 shows a circuit diagram of a filter arrangement where the invention is implemented in a sixth degree filter.

FIG. 9 shows an unbalanced filter arrangement 8F according to the first aspect of the invention, which can replace an impedance converter and a filter of the sixth degree according to the background art. The filter arrangement 8F comprises seven capacitors C10, C11, C12, C13, C14, C15 and C16, three filter coils L10, L11 and L12, an additional winding L13 on the same core 120 as the filter coil L12, two resistors R10 and R11, an amplifier 121 and a current generator 122. The filter coil L12 functions according to the invention both as an active filter component and contributes to give the filter arrangement 8F impedance converting characteristics.

Figure 10:
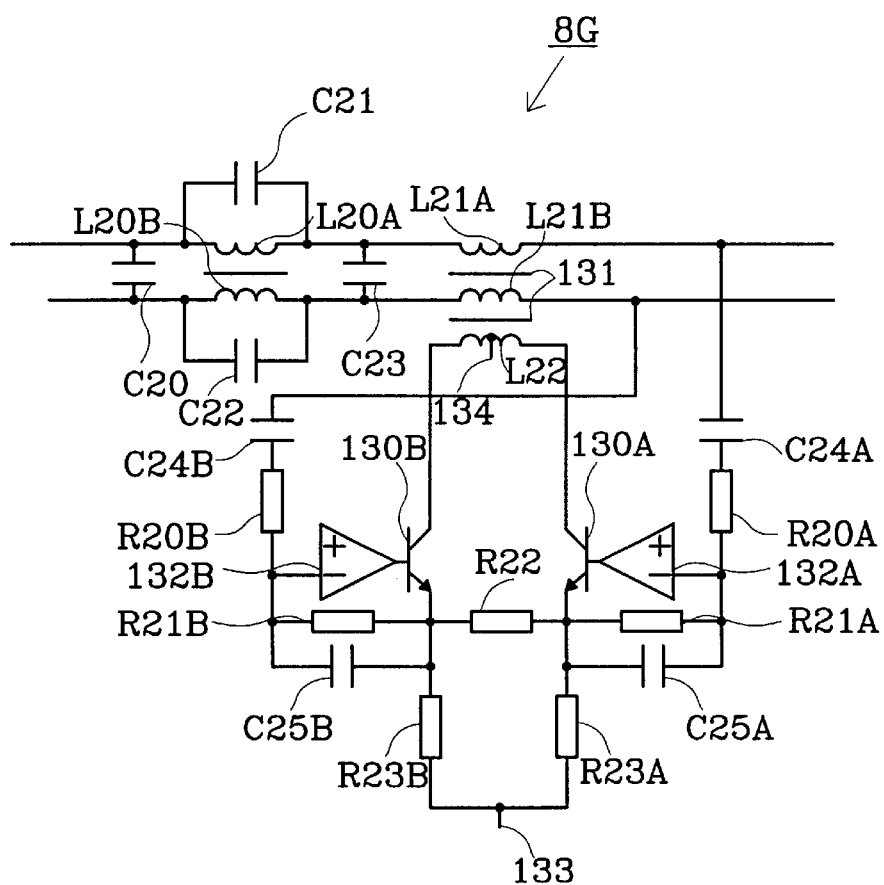
FIG. 10 shows a circuit diagram of an alternative embodiment of a filter arrangement in a balanced embodiment according to the invention.

In FIG. 10 an additional embodiment of a filter arrangement 8G in a balanced form according to the invention is shown. The filter arrangement 8G can replace an impedance converter and a filter in a balanced form according to the background art. Instead of current generators the filter arrangement has two transistors 130A, 130B. The filter arrangement 8G also comprises capacitors C20–C23, C24A, C24B, C25A, C25B, the filter coils L20A, L20B, L21A, L21B, an additional winding L22 on the same core 131 as the filter coils L21A and L22B, resistors R20A, R20B, R21A, R21B, R22, R23A, R23B and amplifiers 132A, 132B. The filter coils L21A and L21B are according to the invention used both as filter components and impedance converting components. A feeding voltage can be applied between the points 133 and 134 on the additional winding L22. The additional winding L22 is used for inducing an electromotive force in the filter coils L21A and L21B in the same manner as is described above.

An advantage with the invention is, as mentioned, that it enables a transformer saving. From the description above of a number of embodiments it is made clear that this transformer saving requires one or several capacitors. Even so, the saving of a transformer is advantageous since transformers are much larger and more expensive than capacitors. Furthermore, capacitors are standard components whereas transformers are not, which make them more difficult to obtain.

In order to generate the aforementioned GIC voltage by means of a filter coil different methods have been mentioned. One mentioned method relies on feeding the filter coil directly with current from current generators working in antiphase. Another method is to current feed an additional winding which by means of mutual induction generates an electromotive force in the filter coil. The current feeding of the additional winding can, as has been shown, be implemented in different ways. One way which has been shown comprises one or two current generators, which feeds the additional winding with current. One additional way, which is shown in conjunction with FIG. 10, involves transistors. The latter method is probably the simplest method of implementing the current feeding.

In the embodiments above the sensed magnitude which the electromotive force has been adapted to has been a voltage to the filter arrangement, but it is also possible that the electromotive force is adapted to another sensed magnitude in or in connection to the filter arrangement such as for example a current.

Figure 11:
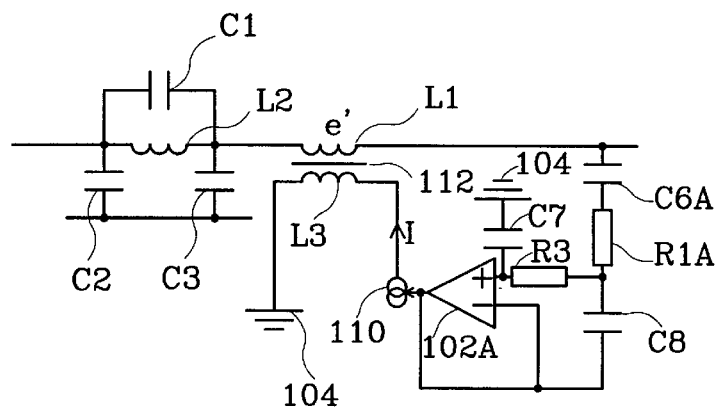
FIG. 11 shows a circuit diagram of an embodiment of a filter arrangement having a low pass impedance converting function according to the invention.

The filter arrangements, 8A–G which have been described in conjunction with FIG. 4–10, are all adapted for having a high pass function as impedance converters, i.e. they amplify high frequencies and are transparent for low frequencies. With smaller configuration adjustments the filter arrangements 8A–G can be modified so that they instead will have a low pass function as impedance converter, which results in that the filter arrangements amplify low frequencies and are transparent to high frequencies. In FIG. 11 there is shown a filter arrangement 8H corresponding to the integrated unit 11 in the filter arrangement 8A modified for having a low pass function as impedance converter. From the figure it is apparent that the things different in the filter arrangement 8H from the integrated unit 11 is that the components C5A and R2A are removed and the capacitors C7 and C8 and a resistor R3 are added, where the capacitor C7 is connected to ground 104.

The invention is not limited to the low pass filtering part of a splitter filter. It can also be utilized in the high pass filtering part, even though this probably is not as interesting when the impedance of the transmission line is approximately real at high frequencies whereby impedance conversion is of less importance.

What is claimed is:

1. A filter arrangement in a telecommunication device, wherein said filter arrangement is located between a transmission line and a receiver of telecommunication signals in a predetermined frequency range, said filter arrangement comprising:
    at least one filter coil having a frequency filtering effect in which an electromotive force is generated;
    an additional winding on a core common to said filter coil, said additional winding adapted to generate an electromotive force by means of mutual induction with said filter coil when said additional winding is fed with a first current; and
    at least one amplifier connected to at least one transistor, wherein said amplifier generates a control signal as a function of an electrical magnitude sensed in or in connection with said filter arrangement, said control signal adjusting said first current to achieve a desired impedance converting effect in said filter arrangement.

2. The filter arrangement according to claim 1, further comprising:
    a means for feeding a current to said at least one filter coil in order to thereby generate said electromotive force by means of self induction in said filter coil.

3. The filter arrangement according to claim 1, further comprising:
    at least one current generator which generates said first current as a function of an electrical magnitude, sensed in or in connection with said filter arrangement.

4. The filter arrangement according to claim 3, wherein said current generator is controlled by at least one amplifier which generates a control signal to said current generator as a function of said sensed electrical magnitude.

5. The filter arrangement according to claim 4, further comprising:
    a capacitor which feeds back said control signal of said amplifier such that said first current becomes inversely proportional to an angular frequency associated with the sensed electrical magnitude.

6. The filter arrangement according to claim 4, wherein said sensed electrical magnitude is a voltage between two balanced input terminals or output terminals In said filter arrangement.

7. The filter arrangement according to claim 1, wherein said filter coil is connected at only one end to at least one filter component having a frequency filtering effect.

8. The filter arrangement according to claim 1, wherein said filter coil is connected at both ends to at least one filter component having a frequency filtering effect.

9. The filter arrangement according to claim 1, wherein:
    said devices adapt the electromotive force so that it becomes proportional to an electric voltage sensed in or in connection with said filter arrangement,
    a quotient between said electromotive force and said sensed voltage becomes frequency dependent, and
    said quotient is small for a predetermined frequency and large for frequencies higher than said predetermined frequency.

10. The filter arrangement according to claim 1, wherein:
    the devices adapt the electromotive force so that it becomes proportional to an electric voltage sensed in or in connection with said filter arrangement, and
    a quotient between said electromotive force and said sensed voltage becomes frequency dependent, and
    said quotient is small for a predetermined frequency and large for frequencies lower than said predetermined frequency.

11. A method of frequency filtering and impedance conversion in a telecommunication device comprising at least one filter arrangement located between a transmission line and a receiver of telecommunication signals In a predetermined frequency range, said method comprising the step of:
    generating an electromotive force in at least one filter coil with a frequency filtering effect in said filter arrangement, wherein said generating step is performed by mutual induction between said filter coil and an additional winding located on a core common to said filter coil by means of feeding the additional winding with a first current; and
    adapting said first current by means of at least one transistor and at least one amplifier, which amplifier generates a control signal as a function of an electrical magnitude, sensed in or in connection with said filter arrangement, wherein said electromotive force is adapted for obtaining a desired impedance converting effect in said filter arrangement.

12. A method according to claim 11, wherein said generating step is performed by self-induction by means of feeding a current to the filter coil.

13. The method according to claim 11, further comprising the step of:
    generating said first current by at least one current generator as a function of an electrical magnitude sensed in or in connection with said filter arrangement.

14. The method according to claim 13, further comprising the step of:
    controlling said current generator by at least one amplifier which generates a control signal to said current generator as a function of said sensed electrical magnitude.

15. The method according to claim 14, further comprising the step of:
    feeding back said control signal of said amplifier with a capacitor such that said first current is inversely proportional to an angular frequency associated with said sensed electrical magnitude.

16. A method according to claim 14, wherein said sensed electrical magnitude is a voltage between two balanced input terminals or output terminals, of said filter arrangements.

17. The method according to claim 11, further comprising the step of:
adapting said electromotive force to be proportional to an electrical voltage sensed in or in connection with said filter arrangement, wherein a quotient between said electromotive force and said sensed current becomes frequency dependent, and said quotient is small for a predetermined frequency and large for frequencies higher than said predetermined frequency.

18. The method according to claim 11, further comprising the step of:
adapting said electromotive force to be proportional to an electrical voltage sensed in or in connection with said filter arrangement, wherein a quotient between said electromotive force and said sensed current becomes frequency dependent, and said quotient is small for a predetermined frequency and large for frequencies lower than said predetermined frequency.

* * * * *